(12) United States Patent
Hwang et al.

(10) Patent No.: US 7,723,775 B2
(45) Date of Patent: May 25, 2010

(54) NAND FLASH MEMORY DEVICE HAVING A CONTACT FOR CONTROLLING A WELL POTENTIAL

(75) Inventors: Byung-jun Hwang, Seoul (KR);
Jae-kwan Park, Suwon-si (KR);
Jee-hoon Han, Yongin-si (KR); So-wi Jin, Hwaseong-si (KR); Nam-su Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/314,192

(22) Filed: Dec. 5, 2008

(65) Prior Publication Data
US 2009/0152614 A1 Jun. 18, 2009

(30) Foreign Application Priority Data
Dec. 17, 2007 (KR) ...................... 10-2007-0132683

(51) Int. Cl.
*H01L 29/788* (2006.01)
(52) U.S. Cl. .................... 257/315; 257/318; 257/E29.3
(58) Field of Classification Search ................. 257/315, 257/318, E29.3
See application file for complete search history.

(56) References Cited

U.S. PATENT DOCUMENTS

| | | | |
|---|---|---|---|
| 6,967,866 B2 * | 11/2005 | Hirata et al. ................. | 365/174 |
| 2006/0234166 A1 | 10/2006 | Lee et al. | |
| 2006/0234447 A1 | 10/2006 | Choi et al. | |
| 2007/0123037 A1 | 5/2007 | Lee et al. | |
| 2008/0048340 A1 | 2/2008 | Lee et al. | |
| 2009/0040824 A1 * | 2/2009 | Iizuka ................... | 365/185.05 |
| 2009/0251967 A1 * | 10/2009 | Higashitani ............ | 365/185.17 |

FOREIGN PATENT DOCUMENTS

| | | | |
|---|---|---|---|
| KR | 10-2006-0108974 A | 10/2006 | |
| KR | 10-2006-0110097 A | 10/2006 | |
| KR | 10-2007-0048909 A | 5/2007 | |

* cited by examiner

*Primary Examiner*—Trung Dang
(74) *Attorney, Agent, or Firm*—Lee & Morse, P.C.

(57) ABSTRACT

A NAND flash memory device includes a plurality of active regions extending in a first direction on a substrate, the active regions including a first well of a first conductivity, a plurality of word lines extending on the first well in a second direction perpendicular to the first direction, first and second dummy word lines extending in a second direction on the first well, the first and second dummy word lines being separated from each other to define an intermediate region therebetween, the first and second dummy word lines being adapted to receive a substantially constant bias voltage of about 0 V, and at least one contact in an active region in the intermediate region between the first and second dummy word lines.

18 Claims, 7 Drawing Sheets

NAND FLASH MEMORY DEVICE HAVING A CONTACT FOR CONTROLLING A WELL POTENTIAL

BACKGROUND OF THE INVENTION

1. Field of the Invention

Example embodiments relate to a semiconductor memory device. More particularly, example embodiments relate to a NAND flash memory device having a contact for controlling a well potential.

2. Description of the Related Art

Flash memory devices are non-volatile memory devices that can retain stored data regardless of power supply. Conventional flash memory devices may be classified into NOR flash memory devices and NAND flash memory devices depending on a connection structure of their respective memory cells with a bit line and a source line.

A conventional NAND flash memory device may include a plurality of memory cells connected in series between bit lines and a common source line, and each of the memory cells may be connected to a respective word line via a gate electrode. The conventional NAND flash memory device may be manufactured, e.g., by a double patterning process, to provide a high integration degree, e.g., a NAND flash memory device formed according to a reduced design rule with minimized pitch in order to decrease a chip size.

Manufacturing of the conventional NAND flash memory device according to a reduced design rule, however, may be difficult to realize with the existing exposure equipment and exposure technology, e.g., existing lithography technology. For example, using the double patterning process to manufacture the NAND flash memory device may include formation of a plurality of periodic patterns with a fine pitch, followed by removal of a portion of the fine patterns from a predetermined region, i.e., a trimming process, to isolate predetermined fine patterns, e.g., to form contacts. The trimming process of fine patterns, however, may be complex and beyond the existing lithography technology.

For example, since a NAND flash memory device according to a reduced design rule may include a device isolation layer defining a plurality of active regions, e.g., a plurality of fine line patterns, isolation of predetermined fine line patterns to form contacts, i.e., a plurality of fine island patterns, may require a complex mask layout to account for a non-uniform shape of the active region, e.g., due to different patterns of the active regions in the NAND flash memory device. Use of a complex layout for trimming may increase manufacturing time and costs, and may decrease reliability and manufacturing yield of the conventional NAND flash memory device.

SUMMARY OF THE INVENTION

Example embodiments are therefore directed to a NAND flash memory device, which substantially overcomes one or more of the disadvantages of the related art.

It is therefore a feature of an example embodiment to provide a NAND flash memory device with a contact in an electrically isolated region, such that a trimming process may be omitted when forming a plurality of separated active regions by a double patterning process to have different positions and functions.

At least one of the above and other features and advantages may be realized by providing a NAND flash memory device, including a plurality of active regions extending in a first direction on a substrate, the active regions including a first well of a first conductivity, a plurality of word lines extending in a second direction on the first well, the second direction being perpendicular to the first direction, intersection regions of the active regions and the word lines defining memory cells, first and second dummy word lines extending in a second direction on the first well, the first and second dummy word lines being separated from each other by a predetermined distance along the first direction to define an intermediate region between the first and second dummy word lines, the first and second dummy word lines being adapted to receive a substantially constant bias voltage of about 0 V, and at least one contact in at least one of the plurality of active region, the at least one contact being positioned in the intermediate region between the first and second dummy word lines and being adapted to apply a well bias voltage to the first well.

The NAND flash memory device may further include a common source line extending in the second direction between a plurality of cell strings and the first and second dummy word lines, the plurality of cell strings extending in the first direction and including a plurality of memory cells. The common source line may include tungsten. The at least one contact may include a second well of the first conductivity in the active region, the second well having a doping concentration higher than a doping concentration of the first well. The contact may further include a conductive plug in contact with the second well, the conductive plug adapted to apply a control voltage to the first well through the second well. The first well may be a P well and the second well is a P+ well. The first and second dummy word lines may have a substantially same structure as the plurality of word lines. The word lines may include a tunneling oxide layer, a charge storing layer, a blocking oxide layer, and a gate electrode layer that are sequentially stacked on the active regions. The gate electrode layer may include one or more of TaN, TiN, W, WN, HfN, and tungsten silicide.

The active regions may have substantially uniform linear structures extending continuously in the first direction along the entire substrate. Portions of the active regions in the intermediate region between the first and second dummy word lines may define first active regions, the at least one contact being positioned in a first active region. The first active regions may have a substantially same planar structure between the first and second dummy word lines. Memory cells may not be defined at intersection regions of the word lines with active region including the at least one contact and at intersection regions of the word lines with second active regions, the second active regions being immediately adjacent to the active region including the at least one contact.

The active regions may include first active regions having substantially uniform linear structures extending continuously in the first direction along the entire substrate, the first regions including the first well, a second active region having a linear structure extending along the first direction in regions other than the intermediate region, the second region including the first well, and a third active region having an island shape extending between two adjacent first active regions, the two adjacent first active regions being in contact with each other via the third active region, the second active region being between the two adjacent first active region, and the third active region being positioned in the intermediate region between the first and second dummy word lines. The at least one contact may be in the third active region, the contact including a second well of the first conductivity in the third active region. Memory cells may not be defined at intersection regions of the two first active regions with the word lines, the two first active regions being immediately adjacent to the second active region along two sides of the second active region. The plurality of word lines may cross the first active regions to define a plurality of cell strings extending in the first direction, a common source line being positioned to extend in the second direction between the plurality of cell strings and the first and second dummy word lines. The NAND flash memory device may further include an isolation region between the third active region and each of the first and second dummy word line.

At least one of the above and other features and advantages may be realized by providing a method of manufacturing a NAND flash memory device, including forming a plurality of active regions extending in a first direction on a substrate by a double patterning process, the active regions including a first well of a first conductivity, forming a plurality of word lines extending in a second direction on the first well, the second direction being perpendicular to the first direction, and intersection regions of the active regions and the word lines defining memory cells, forming first and second dummy word lines extending in a second direction on the first well, such that the first and second dummy word lines are separated from each other by a predetermined distance along the first direction to define an intermediate region therebetween, the first and second dummy word lines being adapted to receive a substantially constant bias voltage of about 0 V, and forming at least one contact in at least one of the plurality of active region, the at least one contact being positioned in the intermediate region between the first and second dummy word lines and being adapted to apply a well bias voltage to the first well. Forming the at least one contact plug may include controlling a potential of the first well via a second well in the intermediate region without using a trimming process for isolating portions of the active regions.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Korean Patent Application No. 10-2007-0132683, filed on Dec. 17, 2007, in the Korean Intellectual Property Office, and entitled: "NAND Flash Memory Device Having Contact for Controlling Well Potential," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Figure 1:
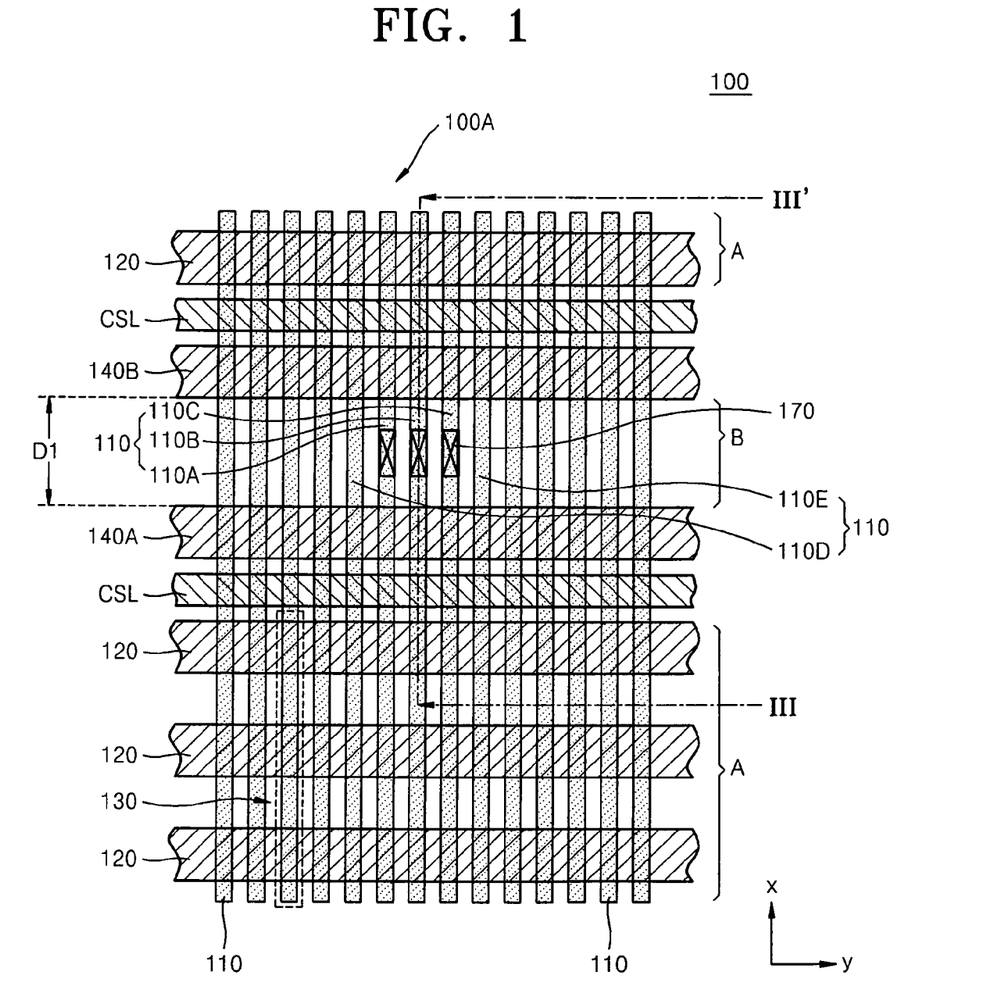
FIG. 1 illustrates a layout of a NAND flash memory device according to an example embodiment.
Figure 2:
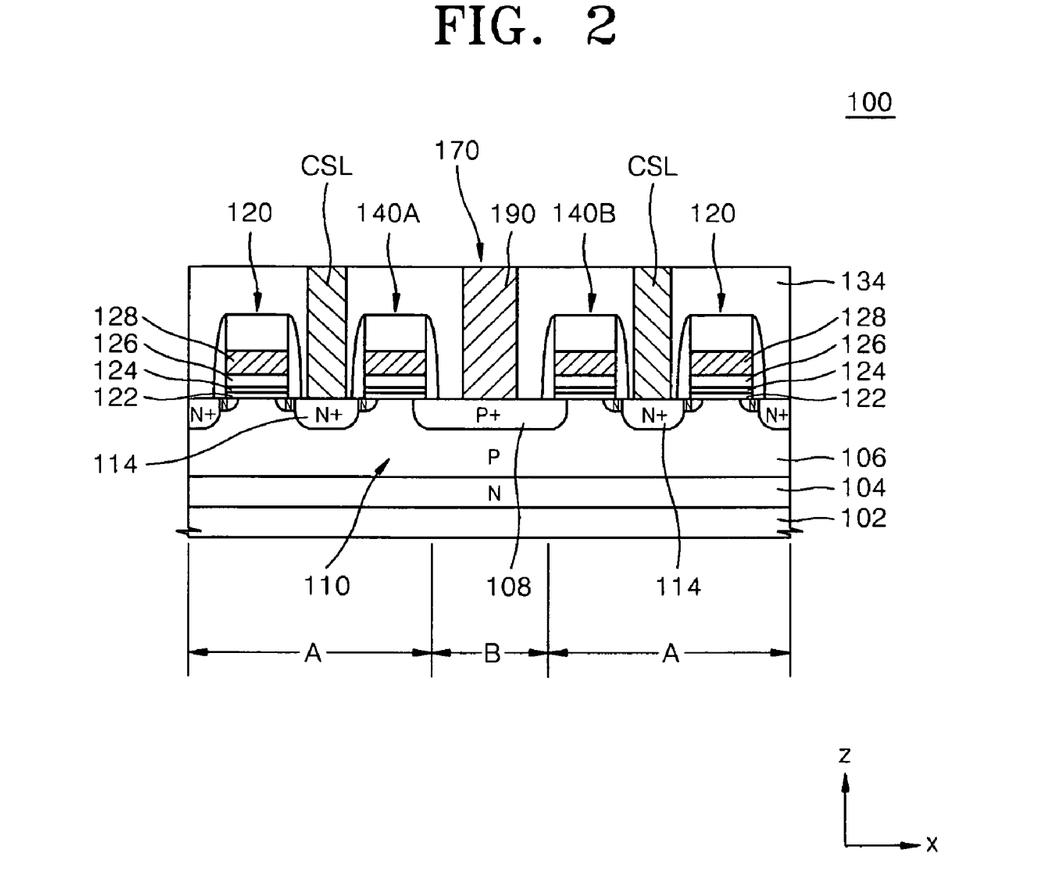
FIG. 2 illustrates a cross-sectional view along line III-III' of FIG. 2.

FIGS. 1-2 illustrate a NAND flash memory device 100 according to an example embodiment. FIG. 1 illustrates a portion of a layout of a cell array in a memory cell block 100A of the NAND flash memory device 100, and FIG. 2 illustrates a cross-sectional view along line III-III' of FIG. 2.

Referring to FIGS. 1-2, the NAND flash memory device 100 may include a plurality of active regions 110 on a semiconductor substrate 102, a plurality of word lines 120 on the semiconductor substrate 102 and crossing the active regions 110, first and second dummy word lines 140A and 140b, and at least one contact 170. The memory cell block 100A of the NAND flash memory device 100 may be on the semiconductor substrate 102, and may include a memory cell region A and a contact region B for a bias voltage. The contact region B may be between two memory cell regions A, as illustrated in FIGS. 1-2.

The plurality of active regions 110 may extend along a first direction, e.g., along the x-axis, as illustrated in FIG. 1. As further illustrated in FIG. 1, the plurality of active regions 110 may be disposed in parallel to each other with constant intervals therebetween, i.e., a substantially constant pitch, in the memory cell region A and in the contact region B. For example, the active regions 110 may extend continuously along the first direction in the memory cell region A and in the contact region B. As illustrated in FIG. 2, an N well 104 may be formed in the plurality of active regions 110, and a P well 106 may be formed in the N well 104.

The plurality of word lines 120 may be formed on the semiconductor substrate 102 in the memory cell region A, e.g., the word lines 120 may not be formed in the contact region B. The word lines 120 may extend along a second direction, e.g., along the y-axis, on the P well 106. The second direction may be perpendicular to the first direction, so the word lines 120 may intersect the active regions 110. Intersection regions between the active regions 110 and the word lines 120 may define memory cells, so a plurality of memory cells may be connected in series to define a cell string 130 along the first direction to overlap a corresponding active region 110, as illustrated in FIG. 1.

The first and second dummy word lines 140A and 140B, as illustrated in FIG. 1, may extend on the semiconductor substrate 102, e.g., on the P well 106 of the active regions 110, along the second direction, i.e., to cross the active regions 110. As further illustrated in FIGS. 1-2, the first and second dummy word lines 140A and 140B may be in the memory cell region A, and may be separated from each other by a predetermined distance D1 measured along the first direction, i.e., along the x-axis, between facing surfaces of the first and second dummy word lines 140A and 140B. A bias voltage of about 0 V may be substantially constantly applied to the first dummy word line 140A and the second dummy word line 140B, so portions of the active regions 110 between the first and second dummy word lines 140A and 140B, i.e., portions of the active regions 110 in the contact region B, may be electrically independent of other portions of the active regions 110, i.e., portions of the active regions 110 in the memory cell regions A. As illustrated in FIG. 2, source/drain regions 114 having a lightly doped drain (LDD) structure may be formed in the memory cell regions A between adjacent word lines 120, and between each of the first and second dummy word lines 140A and 140B and an adjacent word line 120, i.e., in the P well 106 of the active regions 110.

As illustrated in FIG. 2, the first and second dummy word lines 140A and 140B may have a substantially same structure as the word lines 120. For example, each of the word lines 120 and the first and second dummy word lines 140A and 140B may include a tunneling oxide layer 122, a charge storage layer 124, a blocking oxide layer 126, and a gate electrode layer 128 that may be sequentially stacked on the active region 110. Alternatively, although not shown, each of the word lines 120 and the first and second dummy word lines 140A and 140B may include a tunneling oxide layer, a floating gate conductive layer, an intergate dielectric layer, and a control gate layer that may be sequentially stacked on the active region 110.

The tunneling oxide layer 122 may include, e.g., a silicon oxide layer. The charge storage layer 124 may include, e.g., a silicon nitride layer and/or a high-k film having a dielectric constant higher than that of the silicon nitride layer. Examples of materials used to form the charge storage layer 124 may include one or more of a silicon nitride ($Si_3N_4$) layer, a metal oxide layer, and a metal nitride layer. The blocking oxide layer 126 may include, e.g., one or more of $Al_2O_3$, $SiO_2$, $HfO_2$, $ZrO_2$, LaO, LaAlO, LaHfO, and HfAlO. The gate electrode layer 128 may include, e.g., one or more of TaN, TiN, W, WN, HfN, and tungsten silicide.

The at least one contact 170 may be used for applying a bias voltage, and may be formed in the contact region B between the first and second dummy word lines 140A and 140B. As illustrated in FIG. 1, a plurality of contacts 170 may be formed in the memory cell block 100A, e.g., one contact 170 may be formed in a respective active region 110. For example, as further illustrated in FIG. 1, three contacts 170 may be formed in first active regions 110A, 110B and 110C of the active regions 110, so one contact 170 may be formed in each one of the first active regions 110A, 110B and 110C. It is noted that any suitable number of contacts 170, e.g., only one contact 170, in any suitable configuration may be formed in the memory cell block 110A. It is further noted that if a plurality of contacts 170 is formed, resistance may be reduced, as compared to formation of a single contact 170.

Each contact 170 may include a P+ well 108 formed in the P well 106 of the active regions 110 and a conductive plug 190 for applying a control voltage to the P well 106 through the P+ well 108. The conductive plug 190 may penetrate a first interlayer dielectric 134, i.e., a layer disposed on the semiconductor substrate 102 to cover the word lines 120 and the first and second dummy word lines 140A and 140B, to contact the P+ well 108, e.g., the conductive plug 190 may directly contact the P+ well 108. The conductive plug 190 may be formed of any suitable conductive material, e.g., tungsten (W).

The NAND flash memory device 100 may further include common source lines CSL between the word lines 120 and the first and second dummy word lines 140A and 140B, respectively, in the memory cell array region A. As illustrated in FIG. 2, the common source lines CSL may be connected with the source/drain regions 114 formed between the word lines 120 and the first and second dummy word lines 140A and 140B. Each cell string 130 may be connected in series between a bit line and a respective common source line CSL. Each memory cell in the cell string 130 may be connected to a respective world line 120 via a gate electrode. The NAND flash memory device 100 may further include a ground select transistor connected with a ground select line and a string select transistor connected with a string select line. The ground select transistor and the string select transistor may control electrical connection between the plurality of memory cells, the bit lines, and the common source line CSL.

Memory cells may not be formed at intersections of the first active regions 110A, 110B and 110C, i.e., regions including the contacts 170, and the word lines 120. In addition, memory cells may not be formed at intersections of second active regions 110D and 110E, i.e., active regions immediately adjacent to each of the first active regions 110A and 110C illustrated in FIG. 1, with the word lines 120.

In the NAND flash memory device 100 illustrated in FIGS. 1-2, the plurality of active regions 110 may have a substantially same planar structure, i.e., line patterns having a substantially same structure may be formed in the contact region B between the first dummy word line 140A and the second dummy word line 140B. Accordingly, since a bias voltage of about 0 V is constantly applied to the first and second dummy word lines 140A and 140B to electrically isolate the contact region B from the memory cell array regions A, the at least one contact 170 may be formed without removing portions of the active regions 110 via a trimming process.

In particular, since the first and second dummy word lines 140A and 140B extend in the second direction to cross the active regions 110, portions of the active regions 110 between the first and second dummy word lines 140A and 140B in the contact region B may be electrically independent due to the constant bias voltage of about 0 V through the first and second dummy word lines 140A and 140B. Therefore, a potential of the P well 106 may be controlled by means of the P+ well 108 to form the at least one contact 170 without using a trimming process for isolating portions of the active regions 110. Accordingly, a design of a complicated layout for a trimming process may not be required for removing portions of the active regions 110 between the first and second dummy word lines 140A and 140B in the contact region B. Even if substantially small portions of patterns are removed by a trimming process, e.g., little overlay margin between patterns can be removed while forming the mask patterns, no complex layouts may be required, thereby simplifying the entire manufacturing process of the NAND flash memory device 100.

Figure 3:
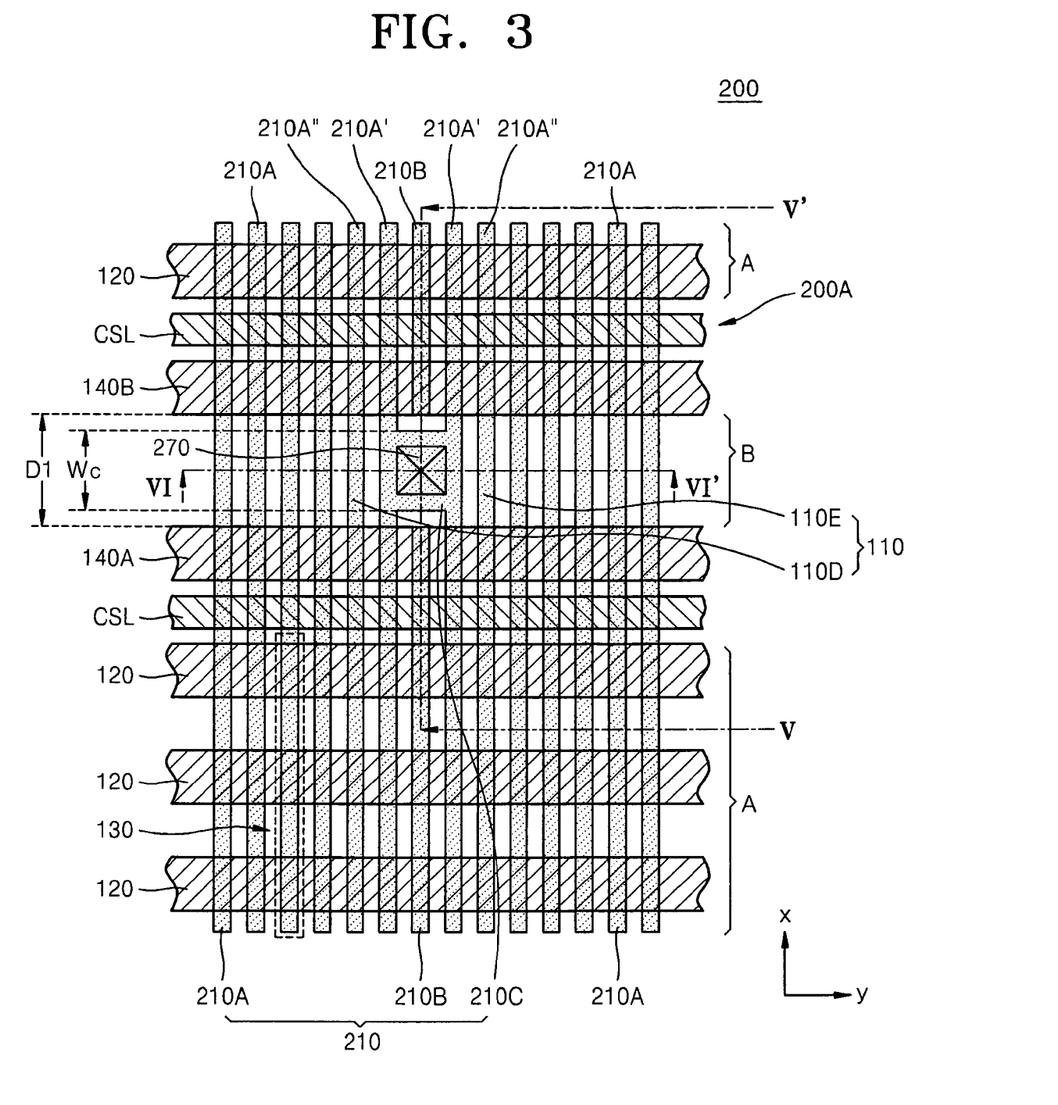
FIG. 3 illustrates a layout of a NAND flash memory device according to another example embodiment.
Figure 4:
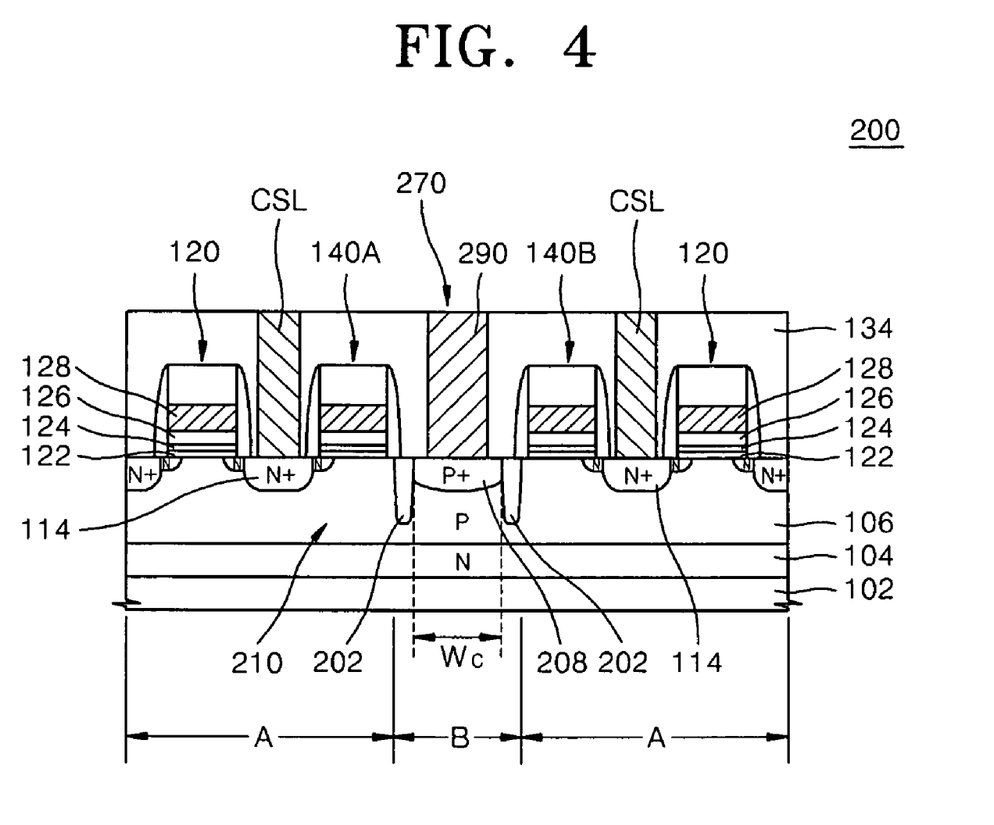
FIG. 4 illustrates a cross-sectional view along line V-V' of FIG. 3.

According to another exemplary embodiment illustrated in FIGS. 3-4, a NAND flash memory device 200 may include a plurality of active regions 210 on the semiconductor substrate 102, the plurality of word lines 120 on the semiconductor substrate 102 and crossing the active regions 210, the first and second dummy word lines 140A and 140B, and at least one contact 270. The NAND flash memory device 200 may have a similar structure to the NAND flash memory device 100 illustrated in FIGS. 1-2, with the exception of the structures of the active regions 210 and the contact 270. A memory cell block 200A of the NAND flash memory device 200 may correspond to the memory cell block 100A of the NAND flash memory device 100 described previously with reference to FIGS. 1-2.

The active regions 210 may include a plurality of first active regions 210A, a second active region 210B, and a third active region 210C. The first and second active regions 210A and 210B may be linear, and may extend along the first direction. The first and second active regions 210A and 210B may be disposed with the same intervals in the memory cell region A.

The first active regions 210A may be substantially the same as the first active regions 110 of the NAND flash memory device 100 described previously with reference to FIGS. 1-2. For example, the first active regions 210A may extend continuously in the memory cell region A and the contact region B along an entire length of the memory cell block 200A.

The second active region 210B may extend along the first direction, i.e., along the x-axis, only in the memory cell region A. For example, as illustrated in FIG. 3, the second active region 210B may not be positioned in the contact region B, so portions of the second active region 210B may be positioned along a substantially same axis to face each other with a space therebetween, i.e., the space between the portions of the second active region 210B may extend along the B contact region. The portions of the second active region 210B may have the distance D1 therebetween along the first direction. For example, as illustrated in FIG. 3, the active regions 210 may include one second active region 210B between two adjacent first active regions 210A'.

The third active region 210C may have an island shape structure, and may be formed only in the contact region B of the memory cell block 200A. For example, as illustrated in FIG. 3, the third active region 210C may have a rectangular structure extending along the first direction, i.e., along the x-axis. The third active region 210C may extend between the two first active regions 210A', so a length of the third active region 210C along the second direction, i.e., the y-axis, may substantially equal a distance between two facing sides of the two first active regions 210A'. In other words, the two first active regions 210A' may be connected to each other via the third active region 210C, i.e., via both sides of the third active region 210C. For example, the third active region 210C may be integral with the two first active regions 210A'. The third active region 210C may extend along the first direction between two portions of the second active region 210B, so a width Wc of the third active region 210C along the first direction may be shorter than the first distance D1 between the two portions of the second active region 210B.

A device isolation layer 202 may be formed in the semiconductor substrate 102 between the third active region 210C and each of the first and second dummy words lines 140A and 140B to define the width Wc of the third active region 210C, as illustrated in FIGS. 3-4. For example, the third active region 210C may be centered along the first direction between the first and second dummy words lines 140A and 140B.

The P well 106 may be formed in each of the first active regions 210A and in the second active region 210B. The contact 270 may be formed in the third active region 210C for applying a well bias voltage to the P well 106. The plurality of word lines 120 on the P well 106 may extend in the second direction in the memory cell region A to cross the first active regions 210A and the second active region 210B. The word lines 120 disposed on the first active regions 210A may form a plurality of the cell strings 130.

The first and second dummy word lines 140A and 140B on the P well 106 may extend in the second direction to cross the first active regions 210A and the second active region 210B in the memory cell region A. The first and second dummy word lines 140A and 140B may be separated from each other by a predetermined distance D1. A bias voltage of about 0 V may be constantly applied to the first and second dummy word lines 140A and 140B. Therefore, the third active region 210C between the first and second dummy word lines 140A and 140B may be electrically independent of other regions of the active region 210 disposed in the memory cell region A.

The contact 270 may be formed in the third active region 210C. Since the third active region 210C is connected with the two first active regions 210A', the contact 270 formed in the third active region 210C may have a larger contact area, as compared to the contact 170 illustrated in FIG. 1, and may effectively control a potential of the P well 106. The contact 270 may include a P+ well 208 formed in the third active region 210C and a conductive plug 290 for applying a control voltage to the P well 106 through the P+ well 208. The conductive plug 290 may penetrate the first interlayer dielectric 134, which covers the word lines 120 and the first and second dummy word lines 140A and 140B, to be connected with the P+ well 208. The conductive plug 290 may be formed of a conductive material, e.g., tungsten (W).

Common source lines CSL may be formed between the word lines 120 and the first and second dummy word lines 140A and 140B, respectively, in the memory cell region A. The common source lines CSL may be connected with the source/drain regions 114 formed between the word lines 120 and the first and second dummy word lines 140A and 140B, respectively.

Memory cells may not be formed at intersections of the first active regions 210A' and the word lines 120. In addition, memory cells may not be formed at intersections of the two first active regions 210A", i.e., one active region immediately adjacent to each of the first active regions 210A', with the word lines 120. Further, memory cells may not be formed at intersections between the second active region 210B and the word lines 120.

FIGS. 5A-5H illustrate cross-sectional views of sequential stages in a method of manufacturing the NAND flash memory device 200 of FIGS. 3-4 according to an example embodiment. The manufacturing method of the NAND flash memory device 200 in FIGS. 5A-5H may include a double patterning process. It is noted that FIGS. 5A-5H illustrate cross-sectional views along line VI-VI' of FIG. 3. It is further note that even though FIGS. 5A-5H illustrate stages in a manufacturing method of the NAND flash memory device 200, substantially same manufacturing stages may be used to manufacture the NAND flash memory device 100 illustrated in FIGS. 1-2.

Figure 5A:
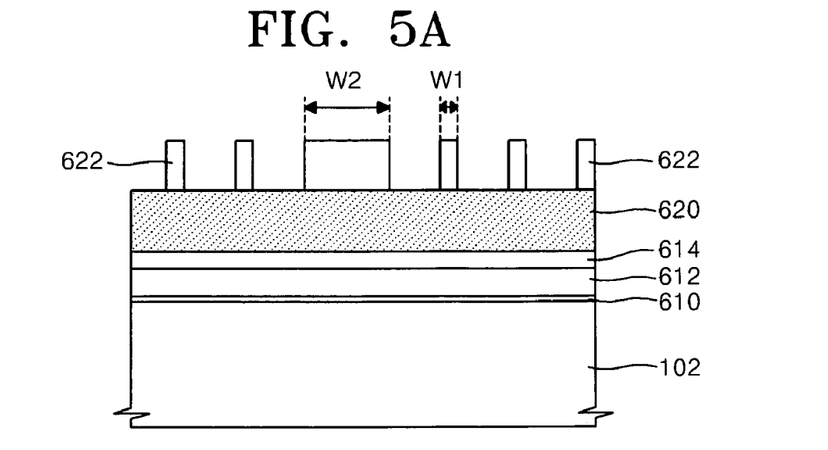
FIGS. 5A-5H illustrate cross-sectional views of sequential stages in a method of manufacturing a NAND flash memory device according to an example embodiment.

Referring to FIG. 5A, a pad oxide layer 610 may be formed on the semiconductor substrate 102, and then a hard mask layer 612 and a first buffer layer 614 may be sequentially formed on the pad oxide layer 610. For example, the hard mask layer 612 may include a silicon nitride layer, and the first buffer layer 614 may include a silicon oxide layer, e.g., a medium temperature oxide (MTO) layer.

A first mask layer 620 may be formed on the hard mask layer 612 and the first buffer layer 614. For example, the first mask layer 620 may be formed of polysilicon.

A plurality of photoresist patterns 622 may be formed on the first mask layer 620 to partially expose an upper surface of the first mask layer 620. As illustrated in FIG. 5A, the photoresist patterns 622 may be spaced apart from each other, so a portion of an upper surface of the first mask layer 620 may be exposed. The photoresist patterns 622 may have a plurality of first patterns having a first width W1 along the first direction, i.e., along the x-axis of FIGS. 3-4, and at least one second pattern having a second width W2 along the first direction. The second width W2 may be larger than the first width W1.

Figure 5B:
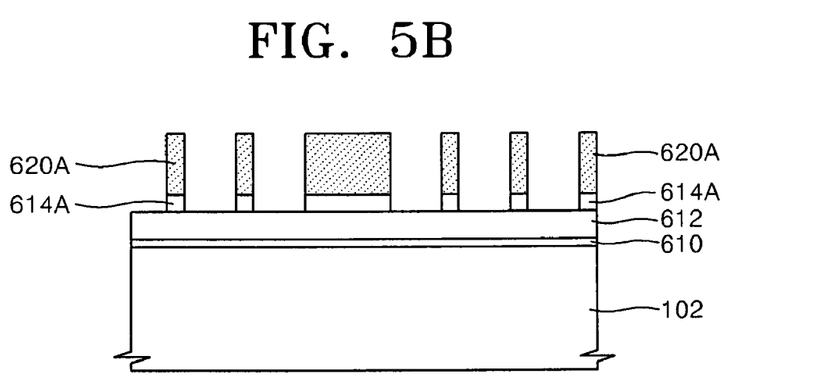

Referring to FIG. 5B, the first mask layer 620 first buffer layer 614 may be etched using the photoresist patterns 622 as an etch mask to form a plurality of first mask patterns 620A. As further illustrated in FIG. 5B, the first buffer layer 614 may be etched using the photoresist patterns 622 and the first mask patterns 620A as an etch mask to form a plurality of first buffer layer patterns 614A. The first mask patterns 620A and the first buffer layer patterns 614A may have first patterns with the first width W1 in a region of the semiconductor substrate 102 corresponding to the first active regions 210A (refer to FIG. 3). Each of the first mask patterns 620A and the first buffer layer patterns 614A may have at least one second pattern with the second width W2 in a region of the semiconductor substrate 102 corresponding to the third active region 210C (refer to FIG. 3). It is noted that the first width W1 of each of the first patterns of the first mask patterns 620A may correspond to a width of each of the first and second active regions 210A and 210B in the second direction, i.e., the y direction, and the second width W2 of the second pattern of the first mask pattern 620A may correspond to a width of the third active region 210C in the second direction. Next, the photoresist patterns 622 may be removed, e.g., completely removed, from the first mask patterns 620A.

Figure 5C:
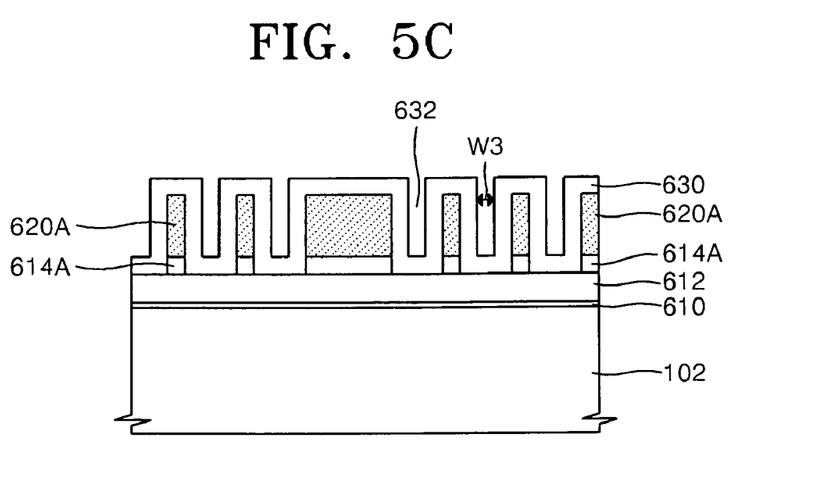

Referring to FIG. 5C, a second buffer layer 630 may be conformally formed to cover the exposed surfaces of the first mask patterns 620A and the first buffer layer patterns 614A. The term "conformally" corresponds to a layer formed with a uniform thickness or substantially uniform thickness along a profile of an underlying layer or structure. For example, sidewalls of the first mask patterns 620A and the first buffer layer patterns 614A, i.e., surfaces extending vertically upward from the hard mask layer 612, and portions of an upper surface of the hard mask 612 between adjacent first mask patterns 620A may be covered with the second buffer layer 630 having a uniform thickness. A recess region 632 may be formed in the second buffer layer 630 between adjacent first mask patterns 620A. The recess region 632 may have a third width W3 corresponding to a width of each of the first active regions 210A and that of the second active region 210B in the second direction. In other words, a thickness of the second buffer layer 630 may be adjusted such that the third width W3 of the recess region 632 may substantially equal the first width W1 of each of the first mask patterns 620A.

The second buffer layer 630 may be formed of a material having an identical or similar etching property to that of the first buffer layer 614. For example, the second buffer layer 630 may be formed of the substantially same material as the first buffer layer 614. In another example, the first and second buffer layer 614 and 630 may be formed of different materials having similar etching properties. For example, the second buffer layer 630 may include a silicon oxide layer formed using atomic layer deposition (ALD).

Figure 5D:
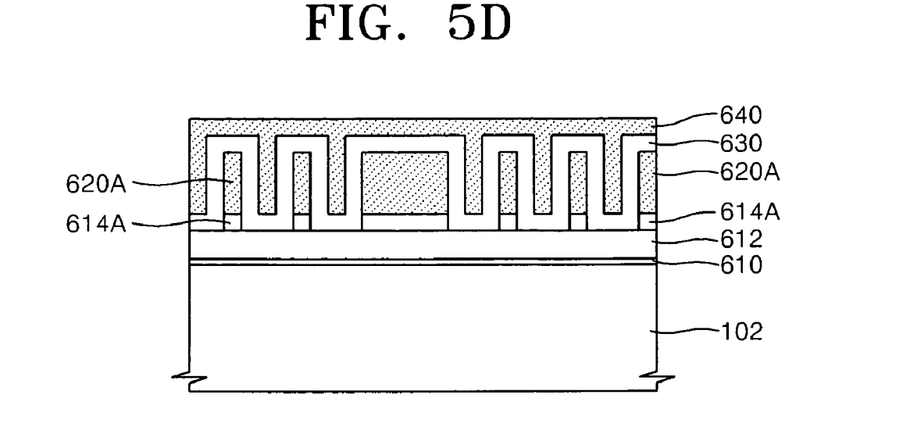

Referring to FIG. 5D, a second mask layer 640 may be formed on the second buffer layer 630 and in the recess regions 632. In other words, the second mask layer 640 may be formed to a thickness, i.e., a distance along a vertical direction, sufficient to completely fill the recess regions 632 of the second buffer layer 630 and to cover upper surfaces of the second buffer layer 630 between adjacent recess regions 632. The second mask layer 640 may be formed of, e.g., polysilicon.

Figure 5E:
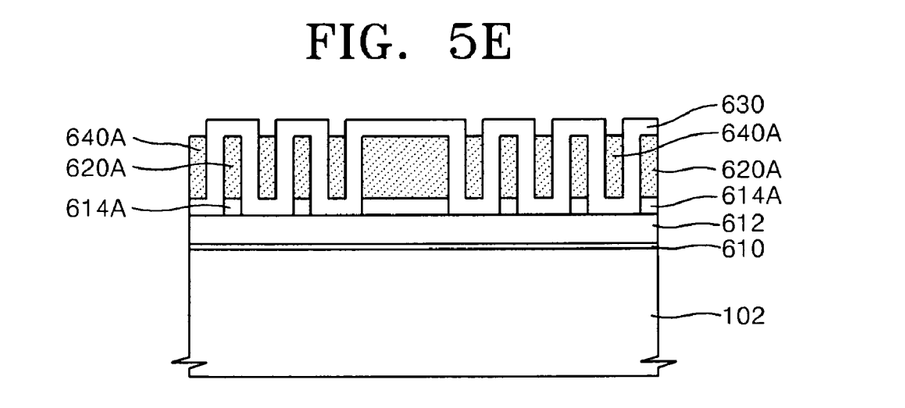

Referring to FIG. 5E, an upper portion of the second mask layer 640 may be partially removed to expose the upper surface of the second buffer layer 630, i.e., portions of the upper surfaces of the second buffer layer 630 between adjacent recess regions 632. Portions of the second mask layer 640 remaining in the recess regions 632 may define a plurality of second mask patterns 640A in the recess regions 632. For example, each exposed portion of the upper surface of the second buffer layer 630 covering a respective first mask pattern 620A may be between adjacent second mask patterns 640A. The upper portion of the second mask layer 640 may be partially removed using, e.g., a wet etching process.

Figure 5F:
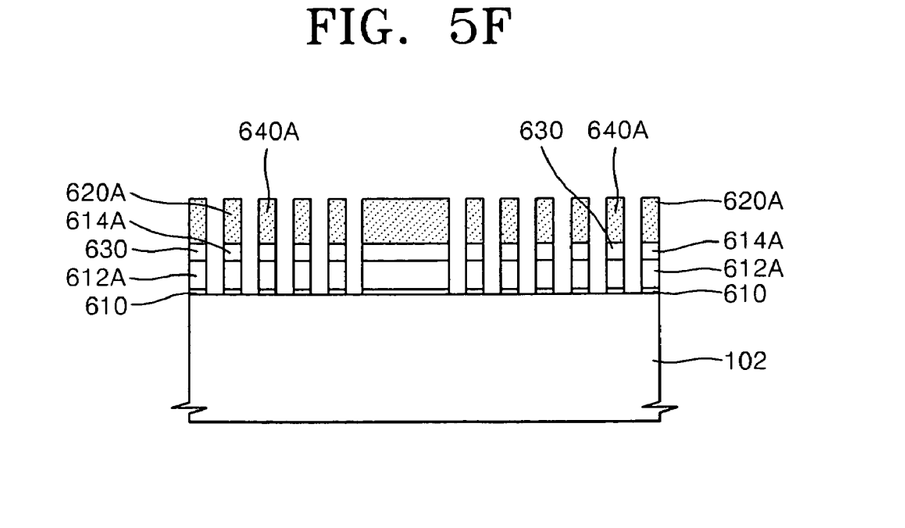

Referring to FIG. 5F, portions of the second buffer layer 630 covering the upper surfaces of the first mask patterns 620A, i.e., portions between adjacent second mask patterns 640A, may be removed to expose upper surfaces of the first mask patterns 620A. As a result, as illustrated in FIG. 5F, upper surfaces of the first and second mask patterns 620A and 640A may be exposed on the semiconductor substrate 102.

Next, the second buffer layer 630 may be etched, e.g., completely removed, using the first mask patterns 620A and the second mask patterns 640A as an etch mask to expose portions of an upper surface of the hard mask layer 612 between the first and second mask patterns 620A and 640A. The hard mask layer 612 may be, e.g., anisotropically dry-etched, to form hard mask patterns 612A under the first and second mask patterns 620A and 640A. An exposed pad oxide layer 610 between adjacent hard mask patterns 612A may be removed to expose an upper surface of the semiconductor substrate 102.

As further illustrated in FIG. 5F, the first and second mask patterns 620A and 640A may be alternately arranged, and may extend to a substantially same height, i.e., upper surfaces of the first and second mask patterns 620A and 640A may be at a substantially same distance as measured along the z-axis from a same reference point, e.g., upper surface of the semiconductor substrate 102. It is noted that the first mask patterns 620A and the second mask patterns 640A may be partially removed during the dry etching of the hard mask layer 612.

Figure 5G:
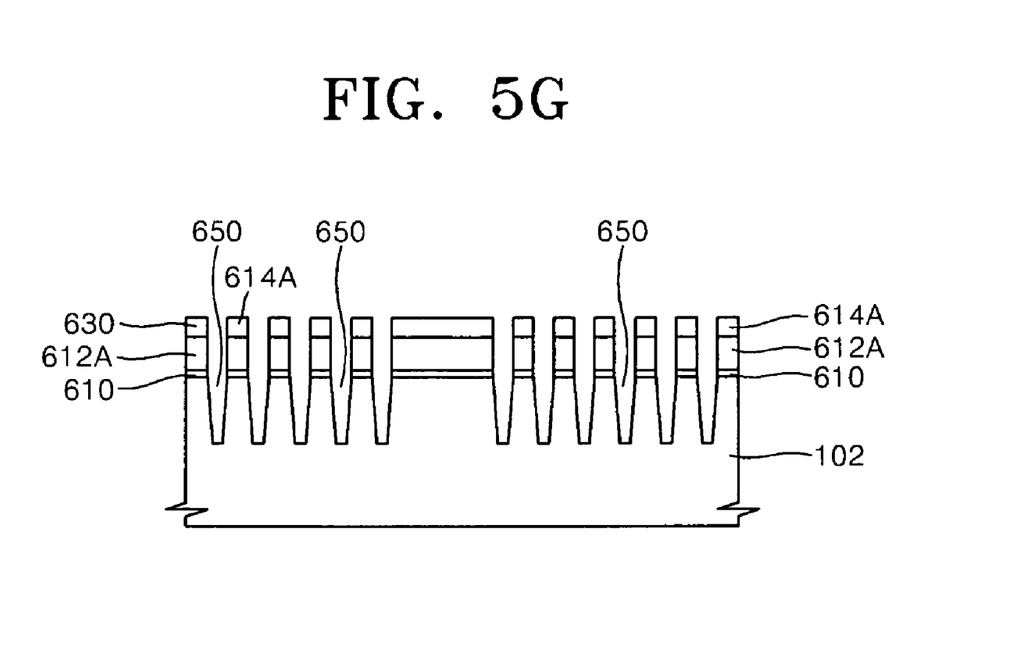

Referring to FIG. 5G, the semiconductor substrate 102 may be, e.g., anisotropically dry-etched using the first mask patterns 620A, the second mask patterns 640A, the first buffer layer patterns 614A, the second buffer layer 630, and the hard mask patterns 612A as an etch mask, to form trenches 650 in the semiconductor substrate 102. As further illustrated in FIG. 5G, during formation of the trenches 650, the first mask patterns 620A and the second mask patterns 640A may be completely removed, i.e., via the dry etching of the semiconductor substrate 102 for forming the trenches 650. It is noted, however, that other methods of forming fine patterns of a semiconductor device are within the scope of the present invention.

Figure 5H:
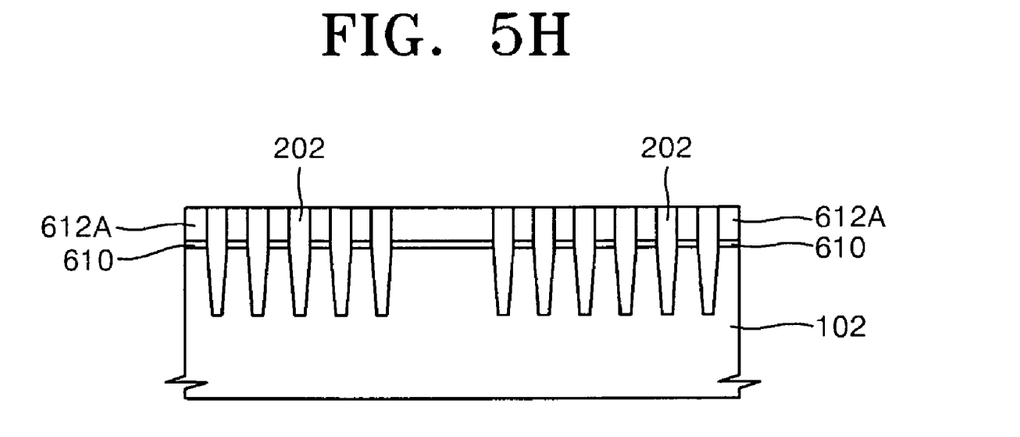

Referring to FIG. 5H, the first buffer layer patterns 614A may be removed, and an insulating material may be deposited in the trenches 650 and on the hard mask patterns 612A. Then, the structure may be planarized using a chemical mechanical polishing (CMP) process until the hard mask pattern 612A may be exposed, so as to form the device isolation layer 202 (refer to FIG. 4).

Next, the hard mask patterns 612A and the pad oxide layer 610 may be removed, and the plurality of word lines 120, the first and second dummy word lines 140A and 140B, the source/drain regions 114 having an LDD structure, common source lines CSL penetrating the first interlayer dielectric 134 to be connected with the source/drain regions 114, and the conductive plug 290 penetrating the interlayer dielectric 134 to be connected with the P+ well 208 may be formed on the semiconductor substrate 102 to complete formation of the NAND flash memory device 200 illustrated in FIG. 4.

In the method of manufacturing the NAND flash memory device 200 described with reference to FIGS. 5A-5H, the device isolation layer 202 defining the active regions 210 may be formed using the double patterning process. Therefore, a plurality of line patterns of the active regions 210 may be repeatedly formed with a fine pitch corresponding to about ½ of a minimum pitch that can be realized through the conventional lithography process. In addition, even when the active regions 210 formed by the second mask patterns 640A include unnecessary active regions, i.e., active regions to be removed in a subsequent process to facilitate isolation of the third active region 210C, a bias voltage of about 0 V may be constantly applied to the first and second dummy word lines 140A and 140B to electrically separate, i.e., electrically independent, the active region 210 between the first and second dummy words lines 140A and 140B from other regions of the active region 210. Therefore, a potential of the P well 106 can be effectively controlled by means of the P+ well 208 at an electrically independent state without a trimming process for isolating the third active region 210C, i.e., a region where the contact 270 may be formed, from the other active regions 210. Accordingly, a design of a complicated layout for a trimming process may not be required, and a trimming process having little overlay margin between patterns can be removed, thereby simplifying the entire manufacturing process.

A NAND flash memory device according to example embodiments may include a pair of dummy word lines that extend in a direction perpendicular to that of a plurality of active regions. A bias voltage of about 0 V may be constantly applied to the dummy word lines. In order to apply a well bias voltage to a first well formed in the active regions, a second well, which may form a contact for a bias voltage, may be formed in the active region that may be electrically independent and between the dummy word lines.

According to an example embodiment, a plurality of active regions, i.e., a plurality of line patterns, may be repeatedly formed with a fine pitch corresponding to about ½ of a minimum pitch realized in a conventional photolithography process. Thereafter, a portion of the active regions, i.e., a region including the second well, may be electrically independent of other regions of the active regions without removing an undesired portion of the active regions through a trimming process. Therefore, a potential of the first well can be effectively controlled by the second well without the trimming process for isolating the active region, where the contact may be formed, from other active regions. Accordingly, the design of a complicated layout for a trimming process may not be required, and a trimming process having little overlay margin between patterns can be removed, thereby simplifying the entire manufacturing process.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A NAND flash memory device, comprising:
a plurality of active regions extending in a first direction on a substrate, the active regions including a first well of a first conductivity;
a plurality of word lines extending in a second direction on the first well, the second direction being perpendicular to the first direction, intersection regions of the active regions and the word lines defining memory cells;
first and second dummy word lines extending in a second direction on the first well, the first and second dummy word lines being separated from each other by a predetermined distance along the first direction to define an intermediate region between the first and second dummy word lines, the first and second dummy word lines being adapted to receive a substantially constant bias voltage of about 0 V; and
at least one contact in at least one of the plurality of active region, the at least one contact being positioned in the intermediate region between the first and second dummy word lines and being adapted to apply a well bias voltage to the first well.

2. The NAND flash memory device as claimed in claim 1, further comprising a common source line extending in the second direction between a plurality of cell strings and the first and second dummy word lines, the plurality of cell strings extending in the first direction and including a plurality of memory cells.

3. The NAND flash memory device as claimed in claim 2, wherein the common source line includes tungsten.

4. The NAND flash memory device as claimed in claim 1, wherein the at least one contact includes a second well of the first conductivity in the active region, the second well having a doping concentration higher than a doping concentration of the first well.

5. The NAND flash memory device as claimed in claim 4, wherein the contact further comprises a conductive plug in contact with the second well, the conductive plug adapted to apply a control voltage to the first well through the second well.

6. The NAND flash memory device as claimed in claim 4, wherein the first well is a P well and the second well is a P+ well.

7. The NAND flash memory device as claimed in claim 1, wherein the first and second dummy word lines have a substantially same structure as the plurality of word lines.

8. The NAND flash memory device as claimed in claim 1, wherein the word lines include a tunneling oxide layer, a charge storing layer, a blocking oxide layer, and a gate electrode layer that are sequentially stacked on the active regions.

9. The NAND flash memory device as claimed in claim 8, wherein the gate electrode layer includes one or more of TaN, TiN, W, WN, HfN, and tungsten silicide.

10. The NAND flash memory device as claimed in claim 1, wherein the active regions have substantially uniform linear structures extending continuously in the first direction along the entire substrate.

11. The NAND flash memory device as claimed in claim 10, wherein portions of the active regions in the intermediate region between the first and second dummy word lines define first active regions, the at least one contact being positioned in a first active region.

12. The NAND flash memory device as claimed in claim 11, wherein the first active regions have a substantially same planar structure between the first and second dummy word lines.

13. The NAND flash memory device as claimed in claim 11, wherein memory cells are not defined at intersection regions of the word lines with active region including the at least one contact and at intersection regions of the word lines with second active regions, the second active regions being immediately adjacent to the active region including the at least one contact.

14. The NAND flash memory device as claimed in claim 1, wherein the active regions include:
   first active regions having substantially uniform linear structures extending continuously in the first direction along the entire substrate, the first regions including the first well;
   a second active region having a linear structure extending along the first direction in regions other than the intermediate region, the second region including the first well; and
   a third active region having an island shape extending between two adjacent first active regions, the two adjacent first active regions being in contact with each other via the third active region, the second active region being between the two adjacent first active region, and the third active region being positioned in the intermediate region between the first and second dummy word lines.

15. The NAND flash memory device as claimed in claim 14, wherein the at least one contact is in the third active region, the contact including a second well of the first conductivity in the third active region.

16. The NAND flash memory device as claimed in claim 14, wherein memory cells are not defined at intersection regions of the two first active regions with the word lines, the two first active regions being immediately adjacent to the second active region along two sides of the second active region.

17. The NAND flash memory device as claimed in claim of 14, wherein the plurality of word lines crosses the first active regions to define a plurality of cell strings extending in the first direction, a common source line being positioned to extend in the second direction between the plurality of cell strings and the first and second dummy word lines.

18. The NAND flash memory device as claimed in claim of 14, further comprising an isolation region between the third active region and each of the first and second dummy word line.

* * * * *